(12) United States Patent
Saito et al.

(10) Patent No.: US 8,153,273 B2
(45) Date of Patent: Apr. 10, 2012

(54) SURFACE TREATED ELECTRODEPOSITED COPPER FOIL AND CIRCUIT BOARD

(75) Inventors: Takahiro Saito, Tochigi-ken (JP); Sadao Matsumoto, Tochigi-ken (JP); Yuuji Suzuki, Tochigi-ken (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 536 days.

(21) Appl. No.: 11/808,049

(22) Filed: Jun. 6, 2007

(65) Prior Publication Data

US 2007/0287020 A1 Dec. 13, 2007

(30) Foreign Application Priority Data

Jun. 7, 2006 (JP) .............................. JP2006-158013

(51) Int. Cl.
*B32B 15/04* (2006.01)
*B32B 15/20* (2006.01)
(52) U.S. Cl. ....................... 428/626; 428/674
(58) Field of Classification Search .................. 428/626, 428/674, 687, 220, 332, 337, 457; 174/256, 174/257
See application file for complete search history.

(56) References Cited

U.S. PATENT DOCUMENTS

| | | | | |
|---|---|---|---|---|
| 5,834,140 A | * | 11/1998 | Wolski et al. | 429/220 |
| 5,863,410 A | * | 1/1999 | Yates et al. | 205/585 |
| 2001/0049027 A1 | * | 12/2001 | Endo et al. | 428/607 |
| 2004/0163842 A1 | * | 8/2004 | Okada et al. | 174/254 |
| 2005/0252778 A1 | * | 11/2005 | Kumagai et al. | 205/76 |
| 2006/0147742 A1 | * | 7/2006 | Matsuda et al. | 428/607 |

FOREIGN PATENT DOCUMENTS

| | | | |
|---|---|---|---|
| CN | 1710737 A | | 12/2005 |
| CN | 1770953 A | | 5/2006 |
| JP | 2004-082495 | * | 3/2004 |
| JP | 2006-103189 | | 4/2006 |
| JP | 2006-155899 | * | 6/2006 |
| WO | WO 2004/070087 | * | 8/2004 |

OTHER PUBLICATIONS

Machine Translation, Matsuda et al., JP 2006-155899, Jun. 2006.*
Machine Translation, Furuya et al., JP 2004-082495, Mar. 2004.*
Tabenkin, "Quality 101: Surface Finish Measurement Basics," Sep. 2004, downloaded from www.qualitymag.com on Nov. 20, 2009 (3 pages).*

* cited by examiner

*Primary Examiner* — Michael Lavilla
(74) *Attorney, Agent, or Firm* — Arent Fox LLP

(57) ABSTRACT

A surface treated electrodeposited copper foil having a smooth M surface; a surface treatment is performed on the M surface being an opposite surface of a surface which contacted with a drum in an electrodeposited copper foil, wherein Rz is 1.0 μm or smaller and Ra is 0.2 μm or smaller on the M surface, electrodeposited copper plating is performed to produce a copper foil under a condition of using a copper sulfate bath, wherein a copper concentration is 50 to 80 g/l, a sulfuric acid concentration is 30 to 70 g/l, a solution temperature is 35 to 45° C., a chloride concentration is 0.01 to 30 ppm, an adding concentration of a total of an organic sulfur based compound, low molecular weight glue and polymeric polysaccharide is 0.1 to 100 ppm and TOC is 400 ppm or smaller, and a current density is 20 to 50 A/dm2.

4 Claims, No Drawings

SURFACE TREATED ELECTRODEPOSITED COPPER FOIL AND CIRCUIT BOARD

CROSS REFERENCES TO RELATED APPLICATIONS

The present invention contains subject matter related to Japanese Patent Application No. 2006-158013 filed in the Japanese Patent Office on Jun. 7, 2006, the entire contents of which being incorporated herein by reference.

BACKGROUND OF THE INVENTION

1. Field of the Invention

The present invention relates to a surface treated electrodeposited copper foil, wherein Rz and Ra on a surface which did not contact with a drum when producing an electrodeposited copper foil (hereinafter, referred to as an M surface) and asperity is a little on the surface, a production method thereof, and a circuit board using the surface treated copper foil.

2. Description of the Related Art

Attainting of a higher density has been pursued in an IC mounting board for driving a liquid crystal display as a display unit of a personal computer, cellular phone and PDA, etc. IC mounting boards are called chip-on films (COF) because the IC is directly mounted on the substrate film.

In chip-on film mounting, a position of the IC is detected by a light transmitting a film having a wiring pattern of a copper foil formed thereon. Visibility of the chip-on film (an ability of detecting the IC by a light) is largely affected by a surface roughness of the copper foil. A film part for a light to transmit is a part where an unnecessary copper foil part except for a copper circuit part is removed by etching, and asperity of a copper foil surface is transferred to the film surface when applying the copper foil to the film and remains. Accordingly, when the copper foil surface is rough, asperity on the film surface becomes large and an amount of a light capable of going straight decreases due to the asperity when the light transmits so as to deteriorate the visibility.

At present, as a countermeasure, a large number of electrodeposited copper foils use a surface which contacted with an electrolytic drum (an S surface, which is the other side of the M surface) as a surface to be put together with a film part in consideration of the visibility. However, since a drum surface is transferred to the S surface, the drum has to be changed when the drum surface becomes rough. Particularly, when using a drum for a long time, stripes arise on the copper foil surface (S surface) due to the drum roughness formed over time, and the stripes deteriorate the visibility and adversely affect flex resistance and elongation, so that maintenance costs of the drum increase, production costs of general products increase and the production capability declines.

Even if the Rz is small in quality, stripes of the drum surface are transferred to the copper foil surface, which therefore results in a trouble in etching, etc.

In a surface treated copper foil of the related arts, an S surface is used as a surface to be applied with a film and a surface treatment is performed on the S surface as a countermeasure. However, when the drum surface becomes rough, since the surface is transferred to the copper foil surface, stripe-shaped asperity is formed thereon and the asperity deteriorates the visibility. Accordingly, the drum has to be changed frequently to keep a smoothness degree on the drum surface and there are disadvantages that productivity of the copper foil declines and the costs increase.

SUMMARY OF THE INVENTION

It is desired to provide a surface treated electrodeposited copper foil having a smooth M surface with a decreased asperity instead of the S surface affected by stripes transferred from a drum surface, and to provide, by using the copper foil, an electrodeposited copper foil for a printed wiring board, multilayer printed wiring board and a chip-on film (hereinafter, they are generally called as a circuit board) having particularly excellent visibility capable of forming a fine pattern circuit thereon.

According to the present invention, there is provided a surface treated electrodeposited copper foil, wherein a surface treatment is performed on an M surface being an opposite surface of a surface which contacted with a drum, and Rz is 1.0 µm or smaller and Ra is 0.2 µm or smaller on the M surface.

In a surface treated electrodeposited copper foil of the present invention, preferably, a number of projections of copper having an average diameter of 2 µm existing on an area of 50 µm×50 µm is three or smaller on the surface treated M surface.

Also, preferably, a film is applied onto the surface treated M surface, and a haze value of the film is 30 or smaller after the copper foil is removed by etching processing.

Preferably, the copper foil has a granular crystal structure. Also, preferably, tensile strength is 400 N/mm$^2$ or lower and elongation is 3% or higher.

Furthermore, preferably, at least one kind of simple substances of Ni, Zn, Cr, Co, Mo and P, alloys and hydrates thereof is adhered to the surface treated M surface.

According to the present invention, there is provided a production method of a surface treated electrodeposited copper foil, comprising the steps of:

producing a copper foil by performing electrodeposited copper plating under a condition of using a copper sulfate bath, wherein a copper concentration is 50 to 80 g/l, a sulfuric acid concentration is 30 to 70 g/l, a solution temperature is 35 to 45° C., a chloride concentration is 0.01 to 30 ppm, an adding concentration of a total of an organic sulfur based compound, low molecular weight glue and polymeric polysaccharide is 0.1 to 100 ppm and TOC (total organic carbon) is 400 ppm or smaller, and a current density is 20 to 50 A/dm$^2$; and performing a surface treatment on an M surface of the copper foil to attain Rz of 1.0 µm or smaller and Ra of 0.2 µm or smaller on the M surface.

According to the present invention, there is provided a circuit board formed by applying a film onto the M surface of the surface treated copper foil as explained above.

According to the present invention, a smooth surface treated electrodeposited copper foil, wherein Rz is 1.0 µm or smaller and Ra is 0.2 µm or smaller in roughness of the M surface, can be provided. Accordingly, the surface treated electrodeposited copper foil of the present invention has an M surface with small Rz and Ra and little asperity, so that it has excellent visibility as a copper foil for a circuit board (a printed wiring board, multilayer printed wiring board and chip-on film) using the M surface and it can be used for a fine pattern circuit.

Also, according to the copper foil production method of the present invention, roughness on the M surface becomes smooth and a drum can be used for a long time, therefore, productivity improves, a production method capable of sustaining a good quality can be provided, and an electrodeposited copper foil can be provided at low costs.

DESCRIPTION OF THE PREFERRED EMBODIMENT

In the present embodiment, a thickness of an electrodeposited copper foil used for a surface treated copper foil is preferably 1 μm to 70 μm. A copper foil having a thinner thickness than 1 μm is not realistic because it is hard to be removed from an electrolytic drum in production and, even if it is removed, it gets wrinkles, etc. and hard to be rolled up.

While, when the foil thickness is thicker than 70 μm, it is not preferable for being out of a specification for COF or FPC, however, if there are demands in other use objects, thicker copper foils may be applied regardless of the above thicknesses.

In an electrodeposited foil of the present embodiment, Rz is 1 μm or thinner and Ra is 0.2 μm or thinner in roughness on the M surface.

The reason for making Rz 1.0 μm or thinner is for placing importance on visibility of the film and, when Rz is larger than 1.0 μm, the surface becomes rough and visibility of the film becomes insufficient. Also, the reason for making Ra 0.2 μm or thinner is for suppressing waves on the copper foil surface small. When Ra is larger than 0.2 μm, waves affect visibility of the film even if Rz is 1.0 μm or smaller. When Rz is 1.0 μm or smaller and Ra is 0.20 μm or smaller, a haze value of a film can be 30 or smaller on an etched part after being applied to the film and etched. Preferably, Rz is 0.8 μm or smaller and Ra is 0.15 μm or smaller.

In the present embodiment, copper sulfate plating bath is used as copper plating bath when producing an electrodeposited copper foil, wherein a surface treatment is to be performed on an M surface thereof, (hereinafter, referred to as an untreated electrodeposited copper foil). In the present embodiment, an efficacy of additives is increased by lowering a sulfate concentration, bath temperature and chloride concentration than those in conventional bath, and smoothness on the M surface is improved. Table 1 shows comparison of bath conditions between copper sulfate plating bath of the related art and that in the present embodiment.

TABLE 1

Copper Sulfate Plating Bath Condition

|  | Conventional Copper Sulfate Plating Bath | Copper Sulfate Plating Bath of the Present Embodiment |
|---|---|---|
| Copper Concentration (g/l) | 80~110 | 50~80 |
| Sulfuric acid Concentration (g/l) | 80~120 | 30~70 |
| Chloride Concentration (ppm) | 30~100 | 0.01~30 |
| Bath Temperature (° C.) | 55~65 | 35~45 |
| Current Density (A/dm$^2$) | 40~70 | 20~50 |

Copper sulfate plating bath for producing the electrodeposited copper foil is added with an organic sulfur based compound and other at least one kind of organic compound as additives. As an organic sulfur based compound, 3-mercapto-1-propanesulfonic acid and bis(3-sulfopropyl)disulfide, etc. may be mentioned. As other organic compounds, a glue, polymeric surfactant and nitrogen containing organic compound, etc. may be used. As a glue, those having low-molecular weight are preferable. As a polymeric surfactant, hydroxyethyl cellulose, polyethylene glycol, polypropylene glycol, polyethylene glycol dimethyl ether and polyethylene oxide, etc. may be mentioned. As a nitrogen-containing organic compound, polyethylene imine and polyacrylic acid amide, etc. may be mentioned. As the additives, an organic sulfur based compound and other at least one kind of organic compound are added by changing the amounts and ratio in a range of 0.1 to 100 ppm. Furthermore, a measurement result of TOC (TOC=total organic carbon, a carbon amount in organics included in a solution) is preferably 400 ppm or smaller when adding the additives. When a value of TOC is large, much impurities are included in the copper foil to largely affect recrystallization, etc., so that the TOC value in the plating bath is preferably 400 ppm or smaller.

Also, the electrodeposited copper foil preferably has a tensile strength of 400 n/mm$^2$ or lower in the normal state. Generally, when a thermal history is applied, an electrodeposited copper foil including little impurities, etc. is more easily softened if bearing distortions. Therefore, normally, copper foils having high tensile strength exhibit a tendency of being more easily softened. When the thermal softening is intense, elongation, wrinkles and other disadvantages easily arise due to heat at the time of applying the surface treated copper foil to a film, so that it is preferable that the copper foils keep a certain degree of tensile strength. Copper foils not having high tensile strength in the normal state are more suitable to a printed wiring board, multilayer printed wiring board and chip-on film wiring board. Accordingly, the tensile strength is preferably 400 N/mm$^2$ or lower.

Also, when elongation is too low, foil breaking arises and handleability on a production line deteriorates, so that copper foils having elongation of 3% or higher in the normal state are preferable.

Tensile strength and elongation of copper foils having a surface treated M surface are regulated to tensile strength of 400 N/mm$^2$ or lower and elongation of 3% or higher as explained above, because such copper foils are suitable for a printed wiring board, multilayer printed wiring board and a chip-on film wiring board.

A surface treatment is performed at least on an M surface of the above untreated electrodeposited copper foil. At least one kind of metal is plated in the surface treatment. As the metal, simple substances of Ni, Zn, Cr, Co, Mo and P, alloys thereof and hydrates thereof may be mentioned. An example of processing for plating a metal is to plate at least one kind of metal selected from Ni, Mo, Co and P or an alloy including one kind of metal, then, plate Zn and plate Cr. Ni or Mo, etc. are preferably 3 mg/dm$^2$ or less because they deteriorate an etching characteristic. Also, as to Zn, when the plating amount is large, it melts at the time of etching to cause deterioration of peel strength, so that 2 mg/dm$^2$ or smaller is preferable. An example of plating bath and a plating condition of each of the above metals are described below.

| Ni Plating Bath | |
|---|---|
| Ni | 10 to 100 g/l |
| H$_3$BO$_3$ | 1 to 50 g/l |
| PO2 | 1 to 10 g/l |
| Bath temperature | 10 to 70° C. |
| Current density | 1 to 50 A/dm$^2$ |
| Processing time | 1 second to 2 minutes |
| pH | 2.0 to 4.0 |
| Ni—Mo Plating Bath | |
| Ni | 10 to 100 g/l |
| Mo | 1 to 30 g/l |
| Trisodium citrate dihydrate | 30 to 200 g/l |
| Bath temperature | 10 to 70° C. |
| Current density | 1 to 50 A/dm$^2$ |
| Processing time | 1 second to 2 minutes |
| pH | 1.0 to 4.0 |

-continued

| Mo—Co Plating Bath | |
| --- | --- |
| Mo | 1 to 20 g/l |
| Co | 1 to 10 g/l |
| Trisodium citrate dihydrate | 30 to 200 g/l |
| Bath temperature | 10 to 70° C. |
| Current density | 1 to 50 A/dm$^2$ |
| Processing time | 1 second to 2 minutes |

| Zn Plating Bath | |
| --- | --- |
| Zn | 1 to 30 g/l |
| NaOH | 10 to 300 g/l |
| Bath temperature | 5 to 60° C. |
| Current density | 0.1 to 10 A/dm$^2$ |
| Processing time | 1 second to 2 minutes |

| Cr Plating Bath | |
| --- | --- |
| Cr | 0.5 to 40 g/l |
| Bath temperature | 20 to 70° C. |
| Current density | 0.1 to 10 A/dm$^2$ |
| Processing time | 1 second to 2 minutes |
| pH | 3.0 or lower |

Preferably, on a surface plated with the above, silane is coated. As the silane to be coated, generally used amino based, vinyl based, cyano group based and epoxy based silane may be mentioned. Particularly, when a film to be applied is polyimide, amino base or cyano group based silane exhibit an effect of improving peel strength.

A surface treated copper foil subjected to the above processing is applied with a film so as to form and a printed wiring board, multilayer printed wiring board, chip-on film wiring board and flexible wiring board.

On the M surface of the above surface treated copper foil, when observing an area of 50 μm×50 μm at n=20 from the above, a copper foil wherein a projection having an average diameter of 2 μm is in the number of three or smaller in average is preferable. When the number of projection increases, it does not only affect the visibility but the processing time of etching has to be long, which may result in a decline of a fine pattern property.

When applying a film onto the above surface treated copper foil, etching an adhered copper foil and measuring the haze value, the haze value is preferably 30 or smaller. When the haze value is larger than 30, the visibility declines, which is unfavorable.

A shape of crystal grains may be a columnar shape or a granular shape as far as the smoothness, etc. of the surface treated copper foil is maintained, but in consideration of flexibility and an etching characteristic, a granular shape crystal is preferable for the surface treated copper foil.

Below, the present invention will be explained based on examples, but the present invention is not limited to them.

Foil Production 1

Examples 1 to 16

Copper sulfate plating solutions (hereinafter, referred to as an electrolytic solution) respectively having compositions shown in Table 2 were subjected to cleaning processing by passing them through an activated carbon filter. Additives used in the present examples were sodium3-mercapto-1-propanesulfonic acid (MPS) as an organic sulfur based compound, PBF (made by Nippi Incorporation) as a low molecular weight glue and hydroxyethyl cellulose (HEC) as polymeric polysaccharide. These additives were added to the electrolytic solution after cleaning processing so as to attain concentrations shown in Table 3 to fabricate electrolytic solutions for producing foils of examples 1 to 16. The thus fabricated electrolytic solutions were used for producing copper foils by electrodeposited foil manufacturing under electrolysis conditions shown in Table 3 by using a precious metal oxide coated titanium electrode as the anode and a titanium rotation drum as the cathode.

Foil Production 2

Comparative Examples 1 to 18

Electrolytic solutions respectively having compositions shown in Table 2 were subjected to cleaning processing by passing them through an activated carbon filter. Then, the electrolytic solutions were added with additives shown in Table 3 so as to attain respective concentrations shown to fabricate electrolytic solutions for producing foils of comparative examples 1 to 18. The thus fabricated electrolytic solutions were used for producing copper foils by electrodeposited foil manufacturing under electrolysis conditions shown in Table 3 by using a precious metal oxide coated titanium electrode as the anode and a titanium rotation drum as the cathode.

Surface Treatment

Examples 1 to 16

A surface treatment was performed on untreated electrodeposited copper foils produced in the examples 1 to 16. An insoluble electrode was used as the anode and each copper foil passed through a line arranged with plating baths of Ni, Zn and Cr in this order, so that plating was performed. After plating with Ni, Zn and Cr, amino based silane was coated to produce a surface treated copper foil. The plating conditions and silane coating amounts are shown in Table 4 and Table 5.

Surface Treatment 2

Comparative Examples 1 to 18

A surface treatment was performed on untreated electrodeposited copper foils produced in the comparative examples 1 to 18. In the same way as in the above examples, an insoluble electrode was used as the anode and each copper foil passed through a line arranged with plating baths of Ni, Zn and Cr in this order, so that plating was performed. After plating with Ni, Zn and Cr, amino based silane was coated to produce a surface treated copper foil. The plating conditions and silane coating amounts are shown in Table 4 and Table 5.

<Evaluation of Surface Roughness>

Surface roughness Rz and Ra of the surface treated copper foils produced in the above examples and comparative examples were measured respectively by using a contact-type surface roughness meter. The surface roughness Rz and Ra are regulated by JIS B 0601-1994 "definition and indication of surface roughness". The Rz indicates "ten-point average roughness" and the Ra indicates "calculated average roughness". The reference length was assumed as 0.8 mm. The results are shown in Table 6.

<Evaluation of Haze Value>

A haze value is an index for evaluating transparency and regulated by JIS K 7105-1981 "optical characteristic testing method for plastic". The smaller the value is, the higher the transparency is. After applying a film onto an M surface of each surface treated copper foil produced in the examples and comparative examples, an applied copper foil was removed by etching, and the film surface after etching removal was measured by a haze meter. The measurement results are shown in Table 6.

<Evaluation of Tensile Strength and Elongation Characteristic>

Measurement was made on each surface treated copper foil produced in the examples and comparative examples as to tensile strength and elongation characteristic in the normal state and after a thermal treatment at 300° C. in a nitrogen atmosphere for 1 hour by using a tensile tester. The results are shown in Table 7.

<Evaluation of Projection on Surface>

On each of the untreated copper foils produced in the examples and comparative examples, an area of 50 μm×50 μm was observed by magnifying with a microscope, and the number of projections of copper having an average diameter of 2 μm was counted by eyes. Counting was made on 20 points at random on a copper foil surface. The results are shown in Table 8.

<Evaluation on Etching Characteristic>

An etching characteristic was evaluated on each untreated copper foil produced in the examples and comparative examples. The evaluation method was to perform etching by a copper chloride solution for a certain time on samples, wherein masking was made by L/S (line and space)=10 μm/10 μm, L/S=30 μm/30 μm and L/S=50 μm/50 μm on the M surface, and evaluating linearity of the circuit pattern. The results are shown in Table 9.

TABLE 2

Electrolytic Bath Composition

| Example or Comparative Example | Copper (g/l) | Sulfuric acid (g/l) | Cl (ppm) |
|---|---|---|---|
| Examples 1~4 | 70 | 50 | 25 |
| Examples 5, 6 | 80 | 35 | 30 |
| Examples 7, 8 | 80 | 65 | 10 |
| Examples 9, 10 | 60 | 35 | 15 |
| Examples 11, 12 | 60 | 65 | 25 |
| Examples 13, 14 | 70 | 40 | 15 |
| Examples 15, 16 | 70 | 60 | 30 |
| Comparative Examples 1, 2 | 90 | 100 | 40 |
| Comparative Examples 3, 4 | 100 | 90 | 35 |
| Comparative Examples 5, 6 | 85 | 110 | 45 |
| Comparative Examples 7, 8 | 90 | 100 | 50 |
| Comparative Examples 9, 10 | 90 | 90 | 35 |
| Comparative Examples 11, 12 | 100 | 110 | 45 |
| Comparative Examples 13, 14 | 85 | 90 | 45 |
| Comparative Examples 15 | 90 | 100 | 0 |
| Comparative Examples 16 | 90 | 50 | 0 |
| Comparative Examples 17 | 70 | 100 | 0 |
| Comparative Examples 18 | 70 | 50 | 0 |

TABLE 3

Additives Composition and Electrolysis Condition

| Example or Comparative Example | MPS Ratio | PBF Ratio | HEC Ratio | Current Density (A/dm$^2$) | Foil Thickness (μm) | Bath Temperature (° C.) |
|---|---|---|---|---|---|---|
| Example 1 | 1 | 4 | 2 | 40 | 9 | 45 |
| Example 2 | 2 | 10 | 3 | 40 | 9 | 45 |
| Example 3 | 3 | 15 | 4 | 40 | 9 | 45 |
| Example 4 | 4 | 15 | 4 | 40 | 9 | 45 |
| Example 5 | 3 | 15 | 4 | 35 | 9 | 40 |
| Example 6 | 3 | 15 | 4 | 40 | 9 | 40 |
| Example 7 | 3 | 15 | 4 | 45 | 9 | 35 |
| Example 8 | 3 | 15 | 4 | 40 | 9 | 40 |
| Example 9 | 3 | 15 | 4 | 40 | 9 | 45 |
| Example 10 | 3 | 15 | 4 | 40 | 9 | 40 |
| Example 11 | 3 | 15 | 4 | 45 | 9 | 35 |
| Example 12 | 4 | 15 | 4 | 35 | 9 | 45 |
| Example 13 | 3 | 15 | 4 | 40 | 9 | 45 |
| Example 14 | 4 | 15 | 4 | 40 | 9 | 35 |
| Example 15 | 3 | 15 | 4 | 40 | 9 | 40 |
| Example 16 | 3 | 15 | 4 | 45 | 9 | 35 |
| Comparative Example 1 | 4 | 15 | 4 | 40 | 9 | 60 |
| Comparative Example 2 | 6 | 20 | 5 | 40 | 9 | 60 |
| Comparative Example 3 | 6 | 20 | 5 | 40 | 9 | 60 |
| Comparative Example 4 | 6 | 20 | 5 | 45 | 9 | 60 |
| Comparative Example 5 | 4 | 15 | 4 | 50 | 9 | 65 |
| Comparative Example 6 | 4 | 15 | 4 | 45 | 9 | 55 |
| Comparative Example 7 | 4 | 15 | 4 | 40 | 9 | 60 |
| Comparative Example 8 | 4 | 15 | 4 | 50 | 9 | 60 |
| Comparative Example 9 | 6 | 20 | 5 | 40 | 9 | 60 |
| Comparative Example 10 | 6 | 20 | 5 | 50 | 9 | 60 |
| Comparative Example 11 | 6 | 20 | 5 | 40 | 9 | 60 |
| Comparative Example 12 | 4 | 15 | 4 | 40 | 9 | 60 |
| Comparative Example 13 | 6 | 20 | 5 | 40 | 9 | 60 |
| Comparative Example 14 | 4 | 15 | 4 | 50 | 9 | 60 |
| Comparative Example 15 | 0 | 0 | 0 | 40 | 9 | 60 |
| Comparative Example 16 | 0 | 0 | 0 | 40 | 9 | 60 |
| Comparative Example 17 | 0 | 0 | 0 | 40 | 9 | 45 |
| Comparative Example 18 | 0 | 0 | 0 | 40 | 9 | 45 |

TABLE 4

Plating Bath Composition

| Kind of Plating Bath | Plating Bath Composition | | |
|---|---|---|---|
| Ni | Ni: 40 g/l | $H_3BO_3$: 30 g/l | $NaH_2PO_2$: 3.6 g/l |
| Zn | Zn: 2.5 g/l | NaOH: 40 g/l | — |
| Cr | Cr: 5 g/l | — | — |

TABLE 5

Plating Condition and Silane Coating Amount

| Kind of Plating Bath | Bath Temperature (°C.) | Current Density (A/dm²) | Processing Time (s) | pH | Plating Amount or Silane Coating Amount (mg/dm²) |
|---|---|---|---|---|---|
| Ni | 20 | 0.2 | 10 | 3.4 | 0.2~0.4 |
| Zn | 20 | 0.3 | 5 | — | 0.03~0.07 |
| Cr | 30 | 5 | 5 | — | 0.05~0.15 |
| Silane | 30 | — | 2 | — | 0.005~0.015 |

TABLE 6

Evaluation of Surface Roughness and Haze Value

| Example or Comparative Example | M Surface Roughness (μm) Rz | M Surface Roughness (μm) Ra | S Surface Roughness (μm) Rz | S Surface Roughness (μm) Ra | M Surface Haze Value |
|---|---|---|---|---|---|
| Example 1 | 0.72 | 0.13 | 0.94 | 0.15 | 23 |
| Example 2 | 0.65 | 0.12 | 0.98 | 0.15 | 23 |
| Example 3 | 0.52 | 0.10 | 0.90 | 0.13 | 20 |
| Example 4 | 0.45 | 0.09 | 0.98 | 0.14 | 18 |
| Example 5 | 0.55 | 0.10 | 0.95 | 0.13 | 20 |
| Example 6 | 0.51 | 0.10 | 0.97 | 0.14 | 21 |
| Example 7 | 0.60 | 0.13 | 0.91 | 0.13 | 22 |
| Example 8 | 0.65 | 0.13 | 0.93 | 0.13 | 23 |
| Example 9 | 0.45 | 0.09 | 0.95 | 0.14 | 19 |
| Example 10 | 0.42 | 0.08 | 0.95 | 0.15 | 17 |
| Example 11 | 0.57 | 0.11 | 0.91 | 0.13 | 20 |
| Example 12 | 0.55 | 0.12 | 0.93 | 0.15 | 20 |
| Example 13 | 0.50 | 0.10 | 0.92 | 0.14 | 19 |
| Example 14 | 0.40 | 0.07 | 0.92 | 0.13 | 17 |
| Example 15 | 0.62 | 0.12 | 0.95 | 0.14 | 23 |
| Example 16 | 0.58 | 0.12 | 0.97 | 0.14 | 21 |
| Comparative Example 1 | 1.06 | 0.25 | 0.90 | 0.14 | 42 |
| Comparative Example 2 | 0.75 | 0.23 | 0.92 | 0.12 | 39 |
| Comparative Example 3 | 0.81 | 0.23 | 0.93 | 0.14 | 40 |
| Comparative Example 4 | 0.75 | 0.22 | 0.94 | 0.15 | 39 |
| Comparative Example 5 | 1.39 | 0.27 | 0.90 | 0.12 | 41 |
| Comparative Example 6 | 1.36 | 0.26 | 0.91 | 0.13 | 43 |
| Comparative Example 7 | 1.31 | 0.25 | 0.95 | 0.15 | 42 |
| Comparative Example 8 | 1.28 | 0.25 | 0.94 | 0.14 | 40 |
| Comparative Example 9 | 0.79 | 0.22 | 0.93 | 0.15 | 41 |
| Comparative Example 10 | 0.72 | 0.23 | 0.91 | 0.14 | 37 |
| Comparative Example 11 | 0.95 | 0.23 | 0.90 | 0.13 | 39 |
| Comparative Example 12 | 1.13 | 0.25 | 0.92 | 0.13 | 42 |
| Comparative Example 13 | 0.97 | 0.23 | 0.96 | 0.14 | 41 |
| Comparative Example 14 | 0.95 | 0.25 | 0.95 | 0.14 | 43 |
| Comparative Example 15 | 2.23 | 0.26 | 0.94 | 0.13 | 50 |
| Comparative Example 16 | 2.05 | 0.25 | 0.92 | 0.14 | 47 |
| Comparative Example 17 | 1.95 | 0.25 | 0.99 | 0.14 | 46 |
| Comparative Example 18 | 1.65 | 0.24 | 0.94 | 0.14 | 43 |

TABLE 7

Evaluation of Tensile Strength and Elongation Characteristic

| Example or Comparative Example | In Normal State Tensile Strength (N/mm²) | In Normal State Elongation (%) | After Thermal Treatment at 300° C. in Nitrogen for 1 Hour Tensile Strength (N/mm²) | After Thermal Treatment at 300° C. in Nitrogen for 1 Hour Elongation (%) |
|---|---|---|---|---|
| Example 1 | 331 | 9.0 | 254 | 13.4 |
| Example 2 | 336 | 8.9 | 255 | 13.2 |
| Example 3 | 324 | 9.1 | 258 | 13.3 |
| Example 4 | 334 | 8.6 | 263 | 13.2 |
| Example 5 | 321 | 9.2 | 248 | 13.5 |
| Example 6 | 319 | 9.4 | 246 | 13.4 |
| Example 7 | 345 | 8.9 | 260 | 13.1 |
| Example 8 | 339 | 8.7 | 258 | 13.0 |
| Example 9 | 335 | 8.9 | 257 | 13.3 |
| Example 10 | 336 | 8.9 | 255 | 13.4 |
| Example 11 | 335 | 9.1 | 254 | 13.3 |
| Example 12 | 329 | 9.0 | 253 | 13.4 |
| Example 13 | 331 | 8.8 | 254 | 13.1 |
| Example 14 | 335 | 8.5 | 257 | 13.0 |
| Example 15 | 325 | 9.2 | 251 | 13.5 |
| Example 16 | 330 | 9.1 | 253 | 13.5 |
| Comparative Example 1 | 301 | 9.3 | 235 | 12.7 |
| Comparative Example 2 | 305 | 9.5 | 233 | 12.8 |
| Comparative Example 3 | 305 | 9.6 | 233 | 12.8 |
| Comparative Example 4 | 306 | 9.5 | 234 | 12.6 |
| Comparative Example 5 | 312 | 9.4 | 239 | 12.5 |
| Comparative Example 6 | 308 | 9.5 | 237 | 12.4 |
| Comparative Example 7 | 295 | 10.1 | 229 | 13.1 |
| Comparative Example 8 | 299 | 9.7 | 228 | 13.0 |
| Comparative Example 9 | 305 | 9.6 | 231 | 12.7 |
| Comparative Example 10 | 310 | 9.3 | 238 | 12.4 |
| Comparative Example 11 | 313 | 9.3 | 234 | 12.6 |
| Comparative Example 12 | 309 | 9.5 | 233 | 12.5 |
| Comparative Example 13 | 298 | 9.9 | 231 | 12.9 |
| Comparative Example 14 | 298 | 9.7 | 230 | 12.8 |
| Comparative Example 15 | 556 | 2.7 | 175 | 16.5 |
| Comparative Example 16 | 549 | 3.1 | 175 | 17.0 |
| Comparative Example 17 | 569 | 2.5 | 178 | 16.8 |
| Comparative Example 18 | 563 | 2.7 | 175 | 16.7 |

TABLE 8

Evaluation of Surface Projection

| Example or Comparative Example | Number of Copper Projection Having Average Diameter of 2 μm or more |
|---|---|
| Example 1 | 2 |
| Example 2 | 0 |
| Example 3 | 1 |
| Example 4 | 0 |
| Example 5 | 1 |
| Example 6 | 0 |
| Example 7 | 0 |
| Example 8 | 2 |
| Example 9 | 0 |
| Example 10 | 0 |
| Example 11 | 0 |
| Example 12 | 0 |
| Example 13 | 0 |
| Example 14 | 0 |
| Example 15 | 1 |
| Example 16 | 1 |
| Comparative Example 1 | 5 |
| Comparative Example 2 | 7 |
| Comparative Example 3 | 5 |
| Comparative Example 4 | 4 |

TABLE 8-continued

Evaluation of Surface Projection

| Example or Comparative Example | Number of Copper Projection Having Average Diameter of 2 μm or more |
|---|---|
| Comparative Example 5 | 8 |
| Comparative Example 6 | 6 |
| Comparative Example 7 | 5 |
| Comparative Example 8 | 6 |
| Comparative Example 9 | 7 |
| Comparative Example 10 | 5 |
| Comparative Example 11 | 4 |
| Comparative Example 12 | 5 |
| Comparative Example 13 | 6 |
| Comparative Example 14 | 5 |
| Comparative Example 15 | 29 |
| Comparative Example 16 | 19 |
| Comparative Example 17 | 25 |
| Comparative Example 18 | 29 |

TABLE 9

Evaluation of Etching Characteristic

| Example or Comparative Example | L/S 10 μm/10 μm | L/S 30 μm/30 μm | L/S 50 μm/50 μm |
|---|---|---|---|
| Example 1 | ○ | ○ | ○ |
| Example 2 | ○ | ○ | ○ |
| Example 3 | ○ | ○ | ○ |
| Example 4 | ○ | ○ | ○ |
| Example 5 | ○ | ○ | ○ |
| Example 6 | ○ | ○ | ○ |
| Example 7 | ○ | ○ | ○ |
| Example 8 | ○ | ○ | ○ |
| Example 9 | ○ | ○ | ○ |
| Example 10 | ○ | ○ | ○ |
| Example 11 | ○ | ○ | ○ |
| Example 12 | ○ | ○ | ○ |
| Example 13 | ○ | ○ | ○ |
| Example 14 | ○ | ○ | ○ |
| Example 15 | ○ | ○ | ○ |
| Example 16 | ○ | ○ | ○ |
| Comparative Example 1 | x | ○ | ○ |
| Comparative Example 2 | x | ○ | ○ |
| Comparative Example 3 | x | ○ | ○ |
| Comparative Example 4 | x | ○ | ○ |
| Comparative Example 5 | x | ○ | ○ |
| Comparative Example 6 | x | ○ | ○ |
| Comparative Example 7 | x | ○ | ○ |
| Comparative Example 8 | x | ○ | ○ |
| Comparative Example 9 | x | ○ | ○ |
| Comparative Example 10 | x | ○ | ○ |
| Comparative Example 11 | x | ○ | ○ |
| Comparative Example 12 | x | ○ | ○ |
| Comparative Example 13 | x | ○ | ○ |
| Comparative Example 14 | x | ○ | ○ |
| Comparative Example 15 | x | x | ○ |
| Comparative Example 16 | x | x | ○ |
| Comparative Example 17 | x | x | ○ |
| Comparative Example 18 | x | x | ○ |

In the evaluation of surface roughness and a haze value, the examples 1 to 16 exhibit Rz of 1.0 μm or smaller, Ra of 0.20 μm or smaller and a haze value of 30 or smaller on the M surfaces. On the other hand, comparing with the examples 1 to 16, the comparative examples 1 to 18 exhibit larger values in all of Rz, Ra and haze value on the M surfaces: Ra are 0.20 μm or larger and the haze values are 30 or larger. Also, in the comparative examples, even when the Rz is as good as those in the examples, the Ra and haze value are widely larger. Accordingly, comparing with the comparative examples, it is considered that the examples have less large asperity on the surfaces in addition to having smaller roughness on the M surface.

In the evaluation of tensile strength and an elongation characteristic, the examples 1 to 16 and comparative examples 1 to 14 exhibit tensile strength of 300 to 330 N/mm$^2$ in the normal state and 230 to 240 N/mm$^2$ after the thermal treatment of 300° C. in nitrogen for 1 hour, while the comparative examples 15 to 18 exhibit tensile strength of 550 to 570 N/mm$^2$ in the normal state and 170 to 180 N/mm$^2$ after the thermal treatment of 300° C. in nitrogen for 1 hour. In the case of being applied with a film and used as a printed wiring board, multilayer printed wiring board and chip-on film, when the thermal softening is intense, elongation, wrinkles and other disadvantages easily arise at the time of setting the foil. Therefore, a copper foil having a certain degree of tensile strength is preferable. Accordingly, the examples 1 to 16 are suitable to be used as copper foils for a printed wiring board, multilayer printed wiring board and chip-on film.

In the evaluation of the surface projection, the number of projections of copper having an average diameter of 2 μm or larger was three or smaller in an area of 50 μm×50 μm in all of the examples 1 to 16. On the other hand, in the comparative examples 1 to 18, the number of projections of copper having an average diameter of 2 μm or larger was four or larger. Accordingly, the examples are considered to have less projection on the surface comparing with the comparative examples and have excellent smoothness.

In an etching evaluation, the examples 1 to 16 exhibited preferable linearity in the circuit patterns of all of L/S=10 μm/10 μm, L/S=30 μm/30 μm and L/S=50 μm/50 μm. On the other hand, in the comparative examples 1 to 14, preferable linearity was not obtained in circuit patterns of L/S=10 μm/1 μm. Furthermore, in the comparative examples 15 to 18, preferable linearity was not obtained in circuit patterns of L/S=10 μm/10 μm, L/S=30 μm/30 μm and L/S=50 μm/50 μm. Accordingly, the examples are considered to have an excellent etching characteristic comparing with that in the comparative examples.

According to the present invention, it is possible to provide a surface treated electrodeposited copper foil having a smooth surface, wherein roughness Rz is 1.0 μm or smaller and Ra is 0.2 μm or smaller on the M surface. Therefore, since the surface treated electrodeposited copper foil of the present invention has small Rz and Ra and less surface asperity, it has excellent visibility as a copper foil for a circuit board (a printed wiring board, multilayer printed wiring board and chip-on film) using the M surface and is capable of composing a fine pattern circuit.

Also, according to the copper foil production method of the present invention, since roughness on an M surface becomes smooth and a drum can be used for a long time, the productivity is improved, the quality is kept for a long time by the production method, costs are suppressed in electrodeposited copper foils.

It should be understood by those skilled in the art that various modifications, combinations, sub-combinations and alternations may occur depending on design requirements and other factors insofar as they are within the scope of the appended claims or the equivalents thereof.

What is claimed is:

1. A copper foil with electro-deposition treated surfaces having a surface-treated M surface of the copper foil, which is a surface opposite to another surface contacted with a surface-treated drum during an electrolytic process, wherein:

a tensile strength of the copper foil is 400 N/mm² or lower and an elongation of the copper foil is 3% or higher;

Rz of the surface treated M surface is 0.72 µm or smaller,

Ra of the surface treated M surface is 0.13 µm or smaller, and the number of projections of copper having an average diameter of 2 µm or more existing in an area of 50 µm×50 µm on the surface-treated M surface is equal to or smaller than three.

2. The copper foil with electro-deposition treated surfaces as set forth in claim 1, wherein said copper foil has a granular crystal structure.

3. The copper foil with electro-deposition treated surfaces as set forth in claim 1, wherein at least one kind of simple substances selected from the group consisting of Ni, Zn, Cr, Co, Mo, P, alloys and hydrates thereof is adhered to said surface treated M surface.

4. A circuit board including the copper foil as set forth in claim 1 and formed by:

applying a film onto the surface-treated M surface of the copper foil, and removing a portion of the copper foil by etching, except for a remaining portion, to form a circuit in the remaining portion.

* * * * *